(12) United States Patent
Yu et al.

(10) Patent No.: US 9,530,371 B2
(45) Date of Patent: *Dec. 27, 2016

(54) GOA CIRCUIT FOR TABLET DISPLAY AND DISPLAY DEVICE

(71) Applicant: Shenzhen China Star Optoelectronics Technology Co., Ltd., Shenzhen, Guangdong (CN)

(72) Inventors: Xiaojiang Yu, Guangdong (CN); Wenying Li, Guangdong (CN); Changyeh Lee, Guangdong (CN); Tzuchieh Lai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 443 days.

This patent is subject to a terminal disclaimer.

(21) Appl. No.: 14/241,079

(22) PCT Filed: Jan. 3, 2014

(86) PCT No.: PCT/CN2014/070120
§ 371 (c)(1),
(2) Date: Feb. 25, 2014

(87) PCT Pub. No.: WO2015/089917
PCT Pub. Date: Jun. 25, 2015

(65) Prior Publication Data
US 2016/0253938 A1    Sep. 1, 2016

(30) Foreign Application Priority Data

Dec. 18, 2013   (CN) .......................... 2013 1 0700124

(51) Int. Cl.
*G09G 3/36*          (2006.01)
*G11C 19/28*         (2006.01)
(Continued)

(52) U.S. Cl.
CPC .............. *G09G 3/3677* (2013.01); *G09G 3/20* (2013.01); *G09G 3/3674* (2013.01);
(Continued)

(58) Field of Classification Search
CPC ...................... G09G 2310/0286; G09G 3/3266; G09G 2300/0408; G09G 3/3674; G09G 2310/0267; G09G 3/3677; G09G 2310/0281; G11C 19/28; G11C 19/184; G11C 19/00; G11C 5/145; G11C 8/08; G11C 7/1078
See application file for complete search history.

(56) References Cited

U.S. PATENT DOCUMENTS

| 5,517,542 A * | 5/1996 | Huq | ...................... G11C 19/184 327/212 |
| 2007/0001953 A1* | 1/2007 | Jang | ...................... G09G 3/3607 345/88 |

(Continued)

FOREIGN PATENT DOCUMENTS

| CN | 102592561 A | 7/2012 |
| CN | 102945660 A | 2/2013 |

(Continued)

*Primary Examiner* — Sanjiv D Patel
(74) *Attorney, Agent, or Firm* — Andrew C. Cheng

(57) ABSTRACT

The present invention relates to a GOA circuit for tablet display and a display device. The GOA circuit comprises cascaded plurality of GOA units, the GOA unit comprises a pull-up control part 400 and a transfer part 500; the transfer part 500 comprises a first thin film transistor T22, the gate thereof is connected with the gate signal point Q(n), the drain and the source are respectively input the clock signal CK(n) and output the turn-on signal ST(n); the pull-up control part comprises: a second thin film transistor T11, the gate thereof is input the turn-on signal ST(n−2), the drain and the source are respectively connected with the horizontal scan line G(n−2) and the gate signal point Q(n); a third (Continued)

tin film transistor T12, the gate thereof is connected with the horizontal scan line G(n−1), the drain and the source are respectively connected with the horizontal scan line G(n−1) and the gate signal point Q(n). The present invention also provides a related display device. The present invention can improve the stability of the GOA circuit and the related display device in high temperature.

6 Claims, 4 Drawing Sheets

(51) Int. Cl.
  *G09G 3/20*  (2006.01)
  *G11C 19/18*  (2006.01)
(52) U.S. Cl.
  CPC .......... *G11C 19/184* (2013.01); *G11C 19/188* (2013.01); *G11C 19/28* (2013.01); *G09G 2300/0408* (2013.01); *G09G 2310/0251* (2013.01); *G09G 2310/0286* (2013.01); *G09G 2310/08* (2013.01); *G09G 2320/0204* (2013.01)

(56) References Cited

U.S. PATENT DOCUMENTS

| | | | | |
|---|---|---|---|---|
| 2010/0134399 | A1* | 6/2010 | Ki | G09G 3/3677 345/94 |
| 2011/0317803 | A1* | 12/2011 | Chiu | G11C 19/28 377/67 |
| 2012/0140871 | A1* | 6/2012 | Yang | G09G 3/20 377/79 |

FOREIGN PATENT DOCUMENTS

| | | |
|---|---|---|
| CN | 103310755 A | 9/2013 |
| CN | 203217931 U | 9/2013 |
| CN | 103426414 A | 12/2013 |
| KR | 20100073294 A | 7/2010 |

\* cited by examiner

GOA CIRCUIT FOR TABLET DISPLAY AND DISPLAY DEVICE

BACKGROUND OF THE INVENTION

1. Field of the Invention

The present invention relates to the tablet display technical field, and in particular to a GOA (Gate Driver on Array) circuit for tablet display and a display device.

2. The Related Arts

The driver of the current tablet display panel horizontal scan line are mainly achieved by the external IC, the external IC can control the approximate charge and discharge of the horizontal scan lines connected with each panel pixel. GOA technology, meaning Gate Driver on Array technology, can use the original manufacturing process of the tablet display panel to fabricate the driving circuit of the horizontal scan line on the substrate surrounding the display region, making it achieve the driver of the horizontal scan line instead of the external IC. GOA technology can simplify the manufacturing process of the display panel, sparing the IC bonding process on the direction of horizontal scan line, it has opportunity to improve the manufacturing process and reduce the cost, and it can improve the integration of the tablet display panel to make itself more suitable for producing the narrow border or no border display products.

The existing circuit usually comprises cascaded plurality of GOA units, each stage of the GOA units corresponds the driving first stage horizontal scan line. The GOA unit mainly comprises a pull-up part, a pull-up control part, a transfer part, a key pull-down part, a pull-down holding part and a boast capacitor utilized to boost the voltage. The pull-up part mainly makes the clock signal output and become the gate signal; the pull-up control part is responsible for controlling the turn-on time of the pull-up part, which is generally connected with the transfer signal or the gate signal transmitted by the front stage GOA circuit; the key pull-down part is responsible for pulling the gate to low voltage in the first time, namely turning off the gate signal; the pull-down holding part is responsible for holding the gate output signal and the gate signal (commonly called Q point) of the pull-up part on the turn-off status (namely negative voltage), usually there are two pull-down holding module operating alternating; the C boast is responsible for boosting Q point second times, it is conducive to G(N) outputting of the pull-up part.

The purpose of the GOA circuit is to output the scan waveform which is output by the integrated circuit through the circuit operation, turning on the pixel switch and thereby inputting the data signal to the ITO electrode. After inputting the data signal, holding on the data signal content until next frame turning on. During the circuit operation process, because a scan circuit is off in the remaining time of a frame after turning on, the scan circuit turn-off (holding) time is much longer than the scanning time, the stability requirement for thin film transistor in the GOA circuit is very high. The high temperature stability of the GOA circuit is one of important factors affecting the GOA technology application. In the high temperature, the leakage current of the thin film transistor composing the GOA circuit becomes large, the output waveform of the GOA circuit may be abnormal.

SUMMARY OF THE INVENTION

Therefore, the purpose in the present invention is to provide a GOA circuit for tablet display, reducing that the leakage current of the thin film transistor affects the GOA circuit output in the high temperature, improving the high temperature stability of the GOA circuit output.

The other purpose in the present invention is to provide a display device using the above GOA circuit, reducing that the leakage current of the thin film transistor affects the GOA circuit output in the high temperature, improving the high temperature stability of the GOA circuit output.

In order to achieve the above purpose, the present invention provides a GOA circuit for tablet display, which comprises cascaded plurality of GOA units, charges to the nth-stage horizontal scan line in the display region according to the nth-stage GOA control unit, the nth-stage GOA unit comprises a pull-up part, a key pull-down part, a pull-down holding part, a pull-up control part, a transfer part and a boast capacitor; the pull-up part, the key pull-down part, the pull-down holding part and the boast capacitor are respectively connected with the gate signal and the nth-stage horizontal scan line, the pull-up control part and the transfer part are respectively connected with the gate signal point;

The transfer part comprises:

A first thin film transistor, the gate thereof is connected with the gate signal point, the drain and the source are respectively input the nth-stage clock signal and are output the turn-on signal;

The pull-up control part comprises:

A second thin film transistor, the gate thereof is input the turn-on signal from the (n−2)th stage GOA unit, the drain and the source are respectively connected with the (n−2)th stage horizontal scan line and the gate signal point;

A third thin film transistor, the gate thereof is connected with the (n−1)th stage horizontal scan line, the drain and the source are respectively connected with the (n−1)th stage horizontal scan line and the gate signal point.

The pull-down holding part comprises:

A fourth thin film transistor, the gate thereof is connected with the first circuit point, the drain and the source are respectively connected with the nth horizontal scan line and are input the first direct current low voltage;

A fifth thin film transistor, the gate thereof is connected with the second circuit point, the drain and the source are respectively connected with the nth horizontal scan line and are input the first direct current low voltage;

A sixth thin film transistor, the gate thereof is connected with the first circuit point, the drain and the source are respectively connected with the (n−1)th stage horizontal scan line and the gate signal point;

A seventh thin film transistor, the gate thereof is connected with the second circuit point, the drain and the source are respectively connected with the (n−1)th stage horizontal scan line and the gate signal point;

A eighth thin film transistor, the gate thereof is connected with the gate signal point, the drain and the source are respectively connected with the first circuit point and are input the first direct current low voltage;

A ninth thin film transistor, the gate thereof is connected with the gate signal point, the drain and the source are respectively connected with the second circuit point and are input the first direct current low voltage;

A tenth thin film transistor, the gate thereof is input a first clock signal, the drain and the source are respectively input a first clock signal and are connected with the first circuit point;

A eleventh thin film transistor, the gate thereof is input a second clock signal, the drain and the source are respectively input the first clock signal and are connected with the first circuit point;

A twelfth thin film transistor, the gate thereof is input the second clock signal, the drain and the source are respectively input the second clock signal and are connected with the second point;

A thirteenth thin film transistor, the gate thereof is input the first clock signal, the drain and the source are respectively input the second clock signal and are connected with the second circuit point;

During operation, the frequencies of the first clock signal and the second clock signal are lower than the nth stage clock signal, the first circuit point and the second circuit point are alternately charged by the first clock signal and the second clock signal and are at high voltage.

Wherein, the pull-up part comprises: a fourteenth thin film transistor, the gate thereof is connected with the gate signal point, the drain and the source are respectively input the nth stage clock signal and are connected with the nth stage horizontal scan line.

Wherein, the key pull-down part comprises: a fifteenth thin film transistor, the gate thereof is connected with the (n+2)th stage scan line, the drain and the source are respectively connected with the nth stage horizontal scan line and are input the direct current low voltage; a sixteenth thin film transistor, the gate thereof is connected with the (n+2)th stage horizontal scan line, the drain and the source are respectively connected with the gate signal point and are input the direct current low voltage;

Wherein, the duty ratio of the nth stage clock signal is less than 50%.

Wherein, the duty ratio of the nth stage clock signal is 40%.

Wherein, the first clock signal is input the cascaded plurality of GOA units through the common metal wire.

Wherein, the second clock signal is input the cascaded plurality of GOA units through the common metal wire.

Wherein, the direct current low voltage signal is input the cascaded plurality of GOA units through the common metal wire.

The present invention also provides a GOA circuit for tablet display, which comprises cascaded plurality of GOA units, charges to the nth-stage horizontal scan line in the display region according to the nth-stage GOA control unit, the nth-stage GOA unit comprises a pull-up part, a key pull-down part, a pull-down holding part, a pull-up control part, a transfer part and a boast capacitor; the pull-up part, the key pull-down part, the pull-down holding part and the boast capacitor are respectively connected with the gate signal and the nth-stage horizontal scan line, the pull-up control part and the transfer part are respectively connected with the gate signal point;

The transfer part comprises:

A first thin film transistor, the gate thereof is connected with the gate signal point, the drain and the source are respectively input the nth-stage clock signal and are output the turn-on signal;

The pull-up control part comprises:

A second thin film transistor, the gate thereof is input the turn-on signal from the (n−2)th stage GOA unit, the drain and the source are respectively connected with the (n−2)th stage horizontal scan line and the gate signal point;

A third thin film transistor, the gate thereof is connected with the (n−1)th stage horizontal scan line, the drain and the source are respectively connected with the (n−1)th stage horizontal scan line and the gate signal point.

The pull-down holding part comprises:

A fourth thin film transistor, the gate thereof is connected with the first circuit point, the drain and the source are respectively connected with the nth horizontal scan line and are input the first direct current low voltage;

A fifth thin film transistor, the gate thereof is connected with the second circuit point, the drain and the source are respectively connected with the nth horizontal scan line and are input the first direct current low voltage;

A sixth thin film transistor, the gate thereof is connected with the first circuit point, the drain and the source are respectively connected with the (n−1)th stage horizontal scan line and the gate signal point;

A seventh thin film transistor, the gate thereof is connected with the second circuit point, the drain and the source are respectively connected with the (n−1)th stage horizontal scan line and the gate signal point;

A eighth thin film transistor, the gate thereof is connected with the gate signal point, the drain and the source are respectively connected with the first circuit point and are input the first direct current low voltage;

A ninth thin film transistor, the gate thereof is connected with the gate signal point, the drain and the source are respectively connected with the second circuit point and are input the first direct current low voltage;

A tenth thin film transistor, the gate thereof is input a first clock signal, the drain and the source are respectively input a first clock signal and are connected with the first circuit point;

A eleventh thin film transistor, the gate thereof is input a second clock signal, the drain and the source are respectively input the first clock signal and are connected with the first circuit point;

A twelfth thin film transistor, the gate thereof is input the second clock signal, the drain and the source are respectively input the second clock signal and are connected with the second point;

A thirteenth thin film transistor, the gate thereof is input the first clock signal, the drain and the source are respectively input the second clock signal and are connected with the second circuit point;

During operation, the frequencies of the first clock signal and the second clock signal are lower than the nth stage clock signal, the first circuit point and the second circuit point are alternately charged by the first clock signal and the second clock signal and are at high voltage.

Wherein, the pull-up part comprises: a fourteenth thin film transistor, the gate thereof is connected with the gate signal point, the drain and the source are respectively input the nth stage clock signal and are connected with the nth stage horizontal scan line.

Wherein, the key pull-down part comprises: a fifteenth thin film transistor, the gate thereof is connected with the (n+2)th stage scan line, the drain and the source are respectively connected with the nth stage horizontal scan line and are input the direct current low voltage; a sixteenth thin film transistor, the gate thereof is connected with the (n+2)th stage horizontal scan line, the drain and the source are respectively connected with the gate signal point and are input the direct current low voltage;

Wherein, the duty ratio of the nth stage clock signal is less than 50%.

Wherein, the duty ratio of the nth stage clock signal is 40%.

The first clock signal is input the cascaded plurality of GOA units through the common metal wire.

The second clock signal is input the cascaded plurality of GOA units through the common metal wire.

The direct current low voltage signal is input the cascaded plurality of GOA units through the common metal wire.

The present invention also provides a display device, which comprises a GOA circuit for tablet display as described above.

The GOA circuit for tablet display in the present invention can improve the stability of the GOA circuit and the relative display device in the high temperature, and can reduce the RC delay of the GOA charging signal. Using the GOA circuit in the present invention can produce the low cost tablet display products with narrow border or no border.

BRIEF DESCRIPTION OF THE DRAWINGS

The following description combines the drawings, through describing in detail the embodiments in the present invention, making the technical solutions and other beneficial effect in the present invention more obvious.

In the drawings.

DETAILED DESCRIPTION OF THE PREFERRED EMBODIMENTS

Figure 1:
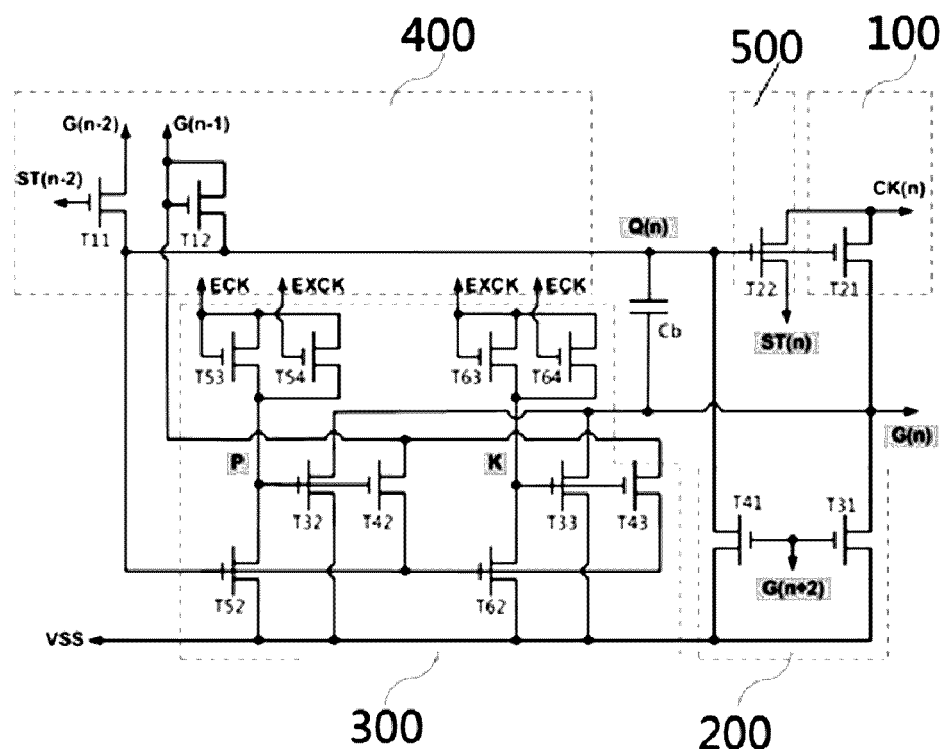
FIG. 1 is a circuit of an embodiment of a GOA circuit (single stage) for tablet display in the present invention.

Referring to FIG. 1, which is a circuit of an embodiment of a GOA circuit (single stage) for tablet display in the present invention. The GOA circuit in the present invention comprises cascaded plurality of GOA units, charges to the nth-stage horizontal scan line G(n) in the display region according to the nth-stage GOA control unit, the nth-stage GOA unit comprises a pull-up part 100, a key pull-down part 200, a pull-down holding part 300, a pull-up control part 400, a transfer part 500 and a boast capacitor Cb; the pull-up part 100, the key pull-down part 200, the pull-down holding part 300 and the boast capacitor Cb are respectively connected with the gate signal Q(n) and the nth-stage horizontal scan line G(n), the pull-up control part 400 and the transfer part 500 are respectively connected with the gate signal point Q(n).

The pull-up part 100 comprises: a thin film transistor T21 directly controlled to charge the nth level horizontal scan line G(n) in the display region, the gate thereof is connected with the gate signal point (Q(n)), the drain and the source of T21 are respectively input the nth stage clock signal CK(n) and are connected with the nth stage horizontal scan line G(n), the gate Q(n) voltage of T21 can directly affect CK(n) charging to G(n).

The key pull-down part 200 comprises a thin film transistor discharging after the end of G(n) charge, which comprises T31 discharging G(n) and T41 discharging Q(n); the gate of T31 is connected with the (n+2)th stage scan line G(n+2), the drain and the source are respectively connected with the nth stage horizontal scan line G(n) and are input the direct current low voltage VSS; the gate of T41 is connected with the (n+2)th stage horizontal scan line G(n+2), the drain and the source are respectively connected with the gate signal point Q(n) and are input the direct current low voltage VSS; T31 and T41 can discharge when G(n+2) is high voltage.

The transfer part 500 comprises a thin film transistor T22, the gate thereof is connected with the gate signal point Q(n), the drain and the source are respectively input the nth-stage clock signal CK(n) and are output the turn-on signal ST(n).

The pull-up control part 400 comprises: a thin film transistor T11, the gate thereof is input the turn-on signal ST(n-2) from the (n-2)th stage GOA unit, the drain and the source are respectively connected with the (n-2)th stage horizontal scan line (G(n-2)) and the gate signal point (Q(n)); a thin film transistor T12, the gate thereof is connected with the (n-1)th stage horizontal scan line G(n-1), the drain and the source are respectively connected with the (n-1)th stage horizontal scan line G(n-1) and the gate signal point Q(n). The GOA circuit in the present invention increases a tin film transistor T12 to charge Q(n), in order to cover the leakage current of Q(n) before boasting, it can make Q(n) more stable before boasting in high temperature.

The thin film transistors T11, T12 and T22 can control that transmitting the turn-on signal from the front stage GOA circuit to the present stage GOA circuit, making the GOA circuit approximately discharge.

The boast capacitor Cb connected between Q(n) and G(n) can boost the Q(n) voltage through the coupling effect of Cb, thereby obtaining the higher Q(n) voltage and the lower RC delay of the GOA charge signal.

The thin film transistor comprised in the pull-down holding part 300 can keep G(n) and Q(n) at low voltage. The pull-down holding part 300 comprises: a thin film transistor T32, the gate thereof is connected with the first circuit point P, the drain and the source are respectively connected with G(n) and are input the first direct current low voltage VSS; a thin film transistor T33, the gate thereof is connected with the second circuit point K, the drain and the source are respectively connected with G(n) and are input the first direct current low voltage VSS; a thin film transistor T42, the gate thereof is connected with the first circuit point P, the drain and the source are respectively connected with G(n-1) and the gate signal point Q(n); a thin film transistor T43, the gate thereof is connected with the second circuit point K, the drain and the source are respectively connected with G(n-1) and the gate signal point Q(n); a thin film transistor T52, the gate thereof is connected with the gate signal point Q(n), the drain and the source are respectively connected with the first circuit point P and are input the first direct current low voltage VSS; a thin film transistor 62, the gate thereof is connected with the gate signal point Q(n), the drain and the source are respectively connected with the second circuit point K and are input the first direct current low voltage VSS; a thin film transistor T53, the gate thereof is input a low frequency clock signal ECK, the drain and the source are respectively input a low frequency clock signal ECK and are connected with the first circuit point P; a thin film transistor T54, the gate thereof is input a low frequency clock signal EXCK, the drain and the source are respectively input the low frequency clock signal ECK and are connected with the first circuit point P; a thin film transistor T63, the gate thereof is input the low frequency clock signal EXCK, the drain and the source are respectively input the low frequency clock signal EXCK and are connected with the second point K; a thin film transistor T64, the gate thereof is input the low frequency clock signal ECK, the drain and the source are respectively input the low frequency clock signal EXCK and are connected with the second circuit point K;

During operation, the frequencies of the low frequency clock signal ECK and the low frequency clock signal EXCK are lower than the high frequency clock signal CK(n), the first circuit point P and the second circuit point K are alternately charged by the low frequency clock signal ECK and the low frequency clock signal EXCK and are at high voltage, thereby alternately controlling the thin film transistors T32 & T42 or T33 & T43 to turn on, in order to keep the low voltage of G(n) or Q(n) during non-charge time. The thin film transistors T54 and T64 can alternately turn on according to the voltage of the low frequency clock signal EXCK an ECK to discharge P or K, it can better ensure the alternate work of T32 & T42 and T33 & T43, used to avoid the thin film transistor being affected by the gate voltage pressure at lone time, improving the working life of the GOA circuit. The thin film transistor T52 is connected with P and the direct current low voltage Vss, the thin film transistor T62 is connected with K and the direct current low voltage Vss, T52 and T62 can turn on when Q(n) is high voltage and thereby turn off T32, T42, T33 and T43, avoiding those affecting the charge of Q(n) and G(n).

The GOA circuit in the present invention can make Q(n) voltage of the gate of the thin film transistor charged to the horizontal scan line more stable before boasting in high temperature, therefore, it has opportunity to improve the high temperature stability of the GOA circuit and reduce the RC delay of the GOA charge signal. Specifically: 1. The method for connecting the thin film transistor T42 and T43 to keep the Q(n) voltage during non-charge time can reduce the leakage current of Q(n) before boasting in high temperature; 2. Adding a thin film transistor in each GOA circuit to charge Q(n), in order to compensate the leakage current of Q(n) before boasting.

Figure 2:
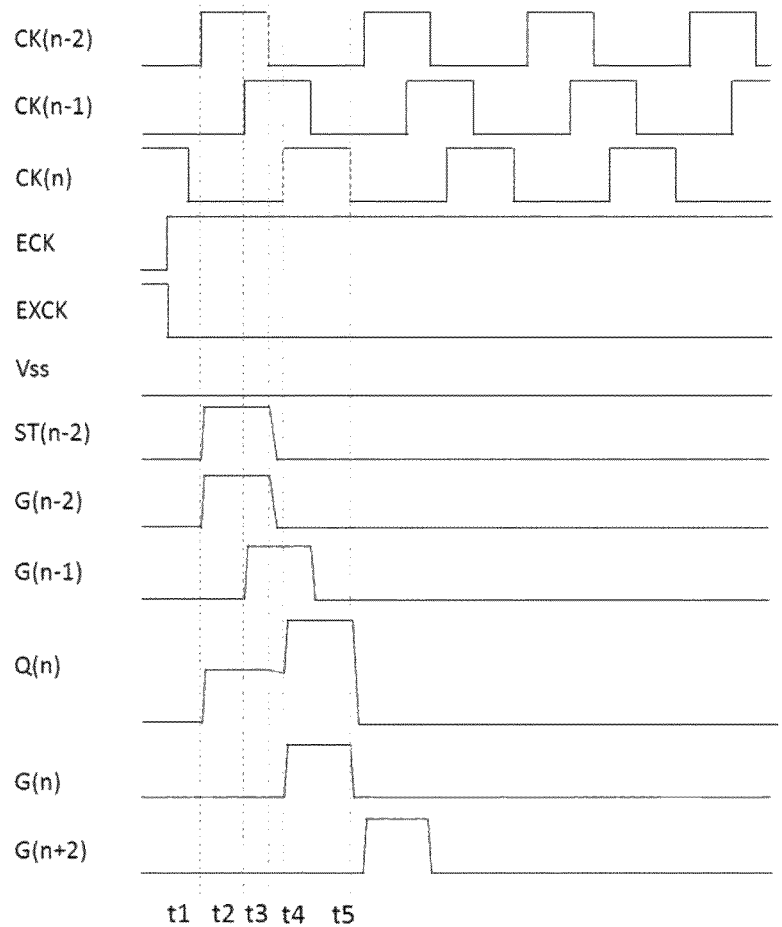
FIG. 2 is an output waveform schematic diagram of a GOA circuit for tablet display at 80° C. in the present invention.

Referring to FIG. 2, which is an output waveform schematic diagram of a GOA circuit for tablet display at 80° C. in the present invention, wherein, the duty ratio of the high frequency clock signal CK(n) is less than 50%, specifically is 40%. In FIG. 2, t1~t4 is the preparing time of G(n) before charging, t4~t5 is the charge time of G(n), after t5 is the discharge time of G(n). the low frequency clock signal ECK and the low frequency clock signal EXCK can be the same frequency and the opposite phase. FIG. 2 can be understood through combining with FIG. 1, at t1, the voltage of CK(n−2) begins rising, the voltages of G(n−2) and ST(n−2) also begin rising, the thin film transistor T11 turns on to charge Q(n). At t2, the voltage of CK(n−1) begins rising, the thin film transistor T12 also turns on to charge Q(n). After boosting Q(n), it can turn on the thin film transistors T52 and T62 and thereby turn off the T32, T42, T33 and T43, avoiding those affecting the charge of Q(n) and G(n). At t3, the voltage of CK(n−2) begins decreasing, the voltages of G(n−2) and ST(n−2) also begin decreasing, there is a leakage current of the thin film transistor T11 to cause the Q(n) voltage decreasing. However, there is a thin film transistor T12 adding in each GOA circuit in the present invention to charge Q(n), in order to compensate the leakage current of Q(n) before boasting, making Q(n) more stable before boasting. At t4, the voltage of CK(n) begins rising, the thin film transistors T21 and T22 turn on, Q(n) boasts to higher voltage and controls that T21 charges to G(n) and T22 charges to ST(n). Since the initial rise time t2 of G(n−1) voltage is earlier than the initial rise time t4 of G(n) voltage, the circuit structure of connecting the drain of T42 and T43 to G(n−1) relative to the circuit structure of connecting the drain of T42 and T43 to the second direct current low voltage Vss2 (not shown in figure) can reduce the leakage current flowing through the thin film transistors T42 and T43 before Q(n) boasting. After Q(n) boasting, the voltages of P and K have been pulled down, T42 and T43 have been turned off, the leakage current of Q(n) can be effectively controlled. At t5, CK(n) begins in a decline, Q(n) voltage is not immediately pulled down, the thin film transistors T21 and T22 remains conductive in a few time after t5 to pull down the voltages of G(n) and ST(n). After that, the voltage of G(n+2) rises, the thin film transistors T31 and T41 turn on, ensuring that G(n) and Q(n) are pulled down to low voltage. After that, T52 and T62 turn off, T32 & T42 and T33 & T43 alternately turn on, in order to keep the low voltage of G(n) and Q(n) during non-charge time. In summary, the present invention can make the voltage of the GOA circuit Q(n) more stable before boasting in high temperature, therefore it has opportunity to obtain the higher Q(n) voltage in the charge period and the less RC delay of the GOA charge signal.

Figure 3:
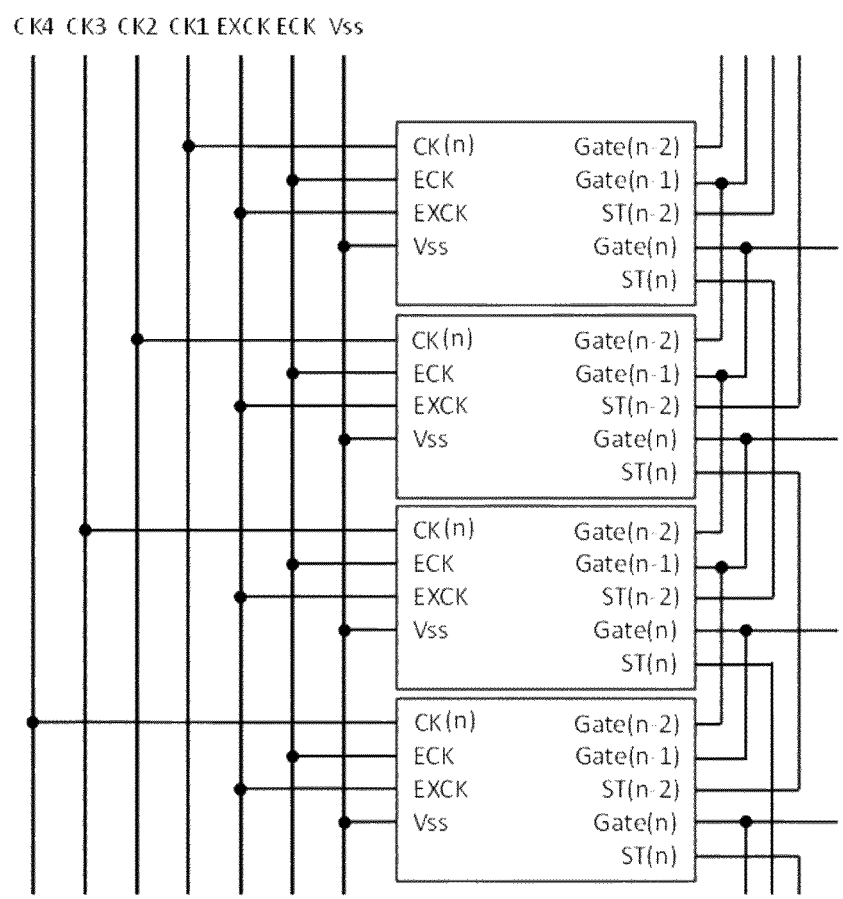
FIG. 3 is a multi-stage schematic diagram of a GOA circuit for tablet display in the present invention.

Referring to FIG. 3, which is a multi-stage schematic diagram of a GOA circuit for tablet display in the present invention. FIG. 3 provides a multi-stage connection method of the GOA circuit in the present invention, the metal wires of the low frequency clock signals ECK and EXCK, the direct current low voltage Vss, the four high frequency clock signals CK1~CK4 are placed surrounding the each stage GOA circuit, the each stage GOA circuit (the internal connection as shown in FIG. 1) is connected with one CK signal of CK1~CK4, G(n−2) and ST(n−2) generated by the (n−2)th stage GOA circuit, G(n−1) generated by the (n−1)th stage GOA circuit and G(n+2) generated by the (n+2)th stage GOA circuit, and then generating G(n) and ST(n) signal. The connection method in FIG. 3 can ensure that the turn-on signal ST(n) of the GOA circuit can be approximately transmitted, making the each stage horizontal scan line be able to be approximately charged and discharged. For the first and end of cascaded GOA unit, it can adopt the method of inputting the activated signal instead of the missing input signal.

The GOA circuit in the present invention can use the original process of the tablet display panel to produce on the substrate surrounding the display region, making it achieve the each stage horizontal scan line driving of the tablet display panel instead of the external IC. The present invention is particularly suitable for producing the tablet display panel with narrow border or no border.

Figure 4:
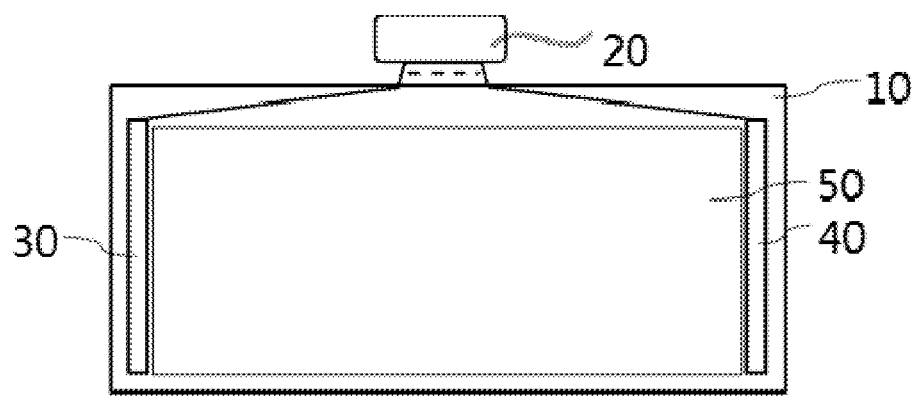
FIG. 4 is a structure diagram of a tablet display device applying a GOA circuit for tablet display in the present invention.

Referring to FIG. 4, which is a structure diagram of a tablet display device applying a GOA circuit for tablet display in the present invention. In FIG. 4, the tablet display device comprises a display substrate 10, the driving control panel 20 on the top of the display substrate 10 provides the drive and control signal to the display substrate 10, the left region 30 and the right region 40 of the display substrate 10 produce the GOA circuit, it can drive the horizontal scan line of the driving display region 50 from the left side and the right side. The GOA circuit accepts the input signal of the driving control panel 20 and approximately generates the control signal of the horizontal scan line, it can control the pixel in the display region 50 to approximately turn on.

In summary, the present invention can improve the stability of the GOA circuit (adopting the high frequency clock signal of which duty ratio is less than 50%) and the related display device in high temperature, and can reduce the RC delay of the GOA charge signal. Applying the GOA circuit in the present invention can produce the low cost tablet display production with narrow border or no border.

The preferred embodiments according to the present invention are mentioned above, which cannot be used to define the scope of the right of the present invention. Those modifications and variations are considered encompassed in the scope of protection defined by the claims of the present invention.

What is claimed is:

1. A GOA circuit for tablet display, which comprises cascaded plurality of GOA units, charges to the nth-stage horizontal scan line in the display region according to the nth-stage GOA control unit, the nth-stage GOA unit comprises a pull-up part, a key pull-down part, a pull-down holding part, a pull-up control part, a transfer part and a boast capacitor; the pull-up part, the key pull-down part, the pull-down holding part and the boast capacitor are respectively connected with the gate signal and the nth-stage horizontal scan line, the pull-up control part and the transfer part are respectively connected with the gate signal point;

wherein, the transfer part comprises:
a first thin film transistor, the gate thereof being connected with the gate signal point, the drain and the source being respectively input the nth-stage clock signal and being output the turn-on signal;

wherein, the pull-up control part comprises:
a second thin film transistor, the gate thereof being input the turn-on signal from the (n−2)th stage GOA unit, the drain and the source being respectively connected with the (n−2)th stage horizontal scan line and the gate signal point;
a third thin film transistor, the gate thereof being connected with the (n−1)th stage horizontal scan line, the drain and the source being respectively connected with the (n−1)th stage horizontal scan line and the gate signal point;

wherein, the pull-down holding part comprises:
a fourth thin film transistor, the gate thereof being connected with the first circuit point, the drain and the source being respectively connected with the nth horizontal scan line and being input the first direct current low voltage;
a fifth thin film transistor, the gate thereof being connected with the second circuit point, the drain and the source being respectively connected with the nth horizontal scan line and being input the first direct current low voltage;
a sixth thin film transistor, the gate thereof being connected with the first circuit point, the drain and the source being respectively connected with the (n−1)th stage horizontal scan line and the gate signal point;
a seventh thin film transistor, the gate thereof being connected with the second circuit point, the drain and the source being respectively connected with the (n−1)th stage horizontal scan line and the gate signal point;
an eighth thin film transistor, the gate thereof being connected with the gate signal point, the drain and the source being respectively connected with the first circuit point and being input the first direct current low voltage;
a ninth thin film transistor, the gate thereof being connected with the gate signal point, the drain and the source being respectively connected with the second circuit point and being input the first direct current low voltage;
a tenth thin film transistor, the gate thereof being input a first clock signal, the drain and the source being respectively input a first clock signal and being connected with the first circuit point;
an eleventh thin film transistor, the gate thereof being input a second clock signal, the drain and the source being respectively input the first clock signal and being connected with the first circuit point;
a twelfth thin film transistor, the gate thereof being input the second clock signal, the drain and the source being respectively input the second clock signal and being connected with the second point;
a thirteenth thin film transistor, the gate thereof being input the first clock signal, the drain and the source being respectively input the second clock signal and being connected with the second circuit point;
during operation, the frequencies of the first clock signal and the second clock signal being lower than the nth stage clock signal, the first circuit point and the second circuit point being alternately charged by the first clock signal and the second clock signal and being at high voltage;
wherein, the pull-up part comprises: a fourteenth thin film transistor, the gate thereof being connected with the gate signal point, the drain and the source being respectively input the nth stage clock signal and being connected with the nth stage horizontal scan line;
wherein, the key pull-down part comprises: a fifteenth thin film transistor, the gate thereof being connected with the (n+2)th stage scan line, the drain and the source being respectively connected with the nth stage horizontal scan line and being input the direct current low voltage; a sixteenth thin film transistor, the gate thereof being connected with the (n+2)th stage horizontal scan line, the drain and the source being respectively connected with the gate signal point and being input the direct current low voltage;
wherein, the duty ratio of the nth stage clock signal is less than 50%.

2. The GOA circuit for tablet display as claimed in claim 1, wherein, the duty ratio of the nth stage clock signal is 40%.

3. The GOA circuit for tablet display as claimed in claim 1, wherein, the first clock signal is input the cascaded plurality of GOA units through the common metal wire.

4. The GOA circuit for tablet display as claimed in claim 1, wherein, the second clock signal is input the cascaded plurality of GOA units through the common metal wire.

5. The GOA circuit for tablet display as claimed in claim 1, wherein, the direct current low voltage signal is input the cascaded plurality of GOA units through the common metal wire.

6. A display device, which comprises a GOA circuit for tablet display as claimed in claim 1.

* * * * *